(12) United States Patent
Xu et al.

(10) Patent No.: US 11,650,704 B2
(45) Date of Patent: May 16, 2023

(54) BONDING STRUCTURE AND ELECTRONIC DEVICE

(71) Applicant: TPK Advanced Solutions Inc., Fujian (CN)

(72) Inventors: Xian Bin Xu, Xiamen (CN); Xiong Min Zhang, Zhangpu County (CN); Bao Huang Chen, Zhangpu County (CN); Qing Hui Lu, Xiamen (CN); Chen-Hsin Chang, Taoyuan (TW); Po-Pin Hung, Kinmen County (TW)

(73) Assignee: TPK Advanced Solutions Inc., Fujian (CN)

( * ) Notice: Subject to any disclaimer, the term of this patent is extended or adjusted under 35 U.S.C. 154(b) by 0 days.

(21) Appl. No.: 17/391,130

(22) Filed: Aug. 2, 2021

(65) Prior Publication Data

US 2023/0036389 A1 Feb. 2, 2023

(51) Int. Cl.
| | | |
|---|---|---|
| *G06F 3/044* | (2006.01) | |
| *G06F 3/041* | (2006.01) | |
| *G06F 3/045* | (2006.01) | |
| *B32B 7/12* | (2006.01) | |
| *B32B 27/32* | (2006.01) | |
| *B32B 27/28* | (2006.01) | |
| *B32B 27/30* | (2006.01) | |
| *G02B 5/30* | (2006.01) | |

(52) U.S. Cl.
CPC ............ *G06F 3/0445* (2019.05); *B32B 7/12* (2013.01); *B32B 27/281* (2013.01); *B32B 27/306* (2013.01); *B32B 27/325* (2013.01); *B32B 2457/08* (2013.01); *B32B 2457/208* (2013.01); *G02B 5/3083* (2013.01); *G06F 2203/04102* (2013.01)

(58) Field of Classification Search
CPC ....... G06F 3/0446; G06F 3/0443; G06F 3/041
See application file for complete search history.

(56) References Cited

U.S. PATENT DOCUMENTS

| 7,268,770 B1* | 9/2007 | Takahata | G06F 3/041 |
| | | | 345/173 |
| 2013/0235550 A1 | 9/2013 | Stevenson et al. | |

(Continued)

FOREIGN PATENT DOCUMENTS

| CN | 101581995 B | 11/2009 |
| KR | 20210086284 A | 7/2021 |

*Primary Examiner* — Nan-Ying Yang
(74) *Attorney, Agent, or Firm* — Cooper Legal Group, LLC (57) ABSTRACT

A bonding structure includes a substrate, a first sensing electrode layer, a second sensing electrode layer, an optical film layer, and a protective layer. The substrate has opposite first and second surfaces. A sensing area and a bonding area are defined on the substrate. The first sensing electrode layer is disposed on the first surface. The second sensing electrode layer is disposed on the second surface. The optical film layer covers the first sensing electrode layer and has a first bonding opening located in the bonding area. The protective layer covers the second sensing electrode layer and has a second bonding opening located in the bonding area. The first and second bonding openings respectively expose a part of the first sensing electrode layer and a part of the second sensing electrode layer and are misaligned in a direction perpendicular to the first or second surface.

20 Claims, 11 Drawing Sheets

(56) References Cited

U.S. PATENT DOCUMENTS

| | | | |
|---|---|---|---|
| 2014/0140036 A1* | 5/2014 | Kim | G06F 3/0443 |
| | | | 362/19 |
| 2014/0313440 A1* | 10/2014 | Hsu | G06F 3/0446 |
| | | | 349/12 |
| 2017/0185187 A1* | 6/2017 | Nakayama | G06F 3/0445 |
| 2018/0246603 A1* | 8/2018 | Yu | G06F 3/044 |
| 2020/0073493 A1* | 3/2020 | Chen | G06F 3/044 |
| 2021/0292555 A1* | 9/2021 | Yun | C08G 73/1067 |

* cited by examiner

BONDING STRUCTURE AND ELECTRONIC DEVICE

BACKGROUND

Technical Field

The present disclosure relates to a bonding structure and an electronic device.

Description of Related Art

Recently, electronic products with foldable screens have been launched on the market. In order to achieve the foldable effect, the material of the substrate of the touch or pressure-sensitive modules of some existing foldable screens are realized by using a plastic film (such as a polymer film). In addition to flexibility, this film needs to be thin, have high hardness, have high temperature resistance, and have high light transmission characteristics.

However, the aforementioned thin substrate is prone to cracks when the edge of the substrate is impacted, which may further affect the sensing function of the sensing electrode provided on the substrate. Not only that, when bonded with a flexible circuit board, the aforementioned thin substrate is also prone to cracks due to the pressing force, which may affect the signal transmission function between the sensing electrode provided on the substrate and the flexible circuit board. Although CN101581995B discloses a double-sided bonding technology, it does not teach how to overcome the cracks caused by the bonding of the thin substrate.

Accordingly, how to provide a bonding structure to solve the aforementioned problems has become an important issue to be solved by those in the industry.

SUMMARY

An aspect of the disclosure is to provide a bonding structure that can efficiently solve the aforementioned problems.

According to an embodiment of the disclosure, a bonding structure includes a substrate, a first sensing electrode layer, a second sensing electrode layer, an optical film layer, and a protective layer. The substrate has a first surface and a second surface opposite to each other. A sensing area and a bonding area are defined on the substrate. The first sensing electrode layer is disposed on the first surface. The second sensing electrode layer is disposed on the second surface. The optical film layer covers the first sensing electrode layer and has a first bonding opening located in the bonding area. The protective layer covers the second sensing electrode layer and has a second bonding opening located in the bonding area. The first bonding opening and the second bonding opening respectively expose a part of the first sensing electrode layer and a part of the second sensing electrode layer, and the first bonding opening and the second bonding opening are misaligned in a direction perpendicular to the first surface or the second surface.

In an embodiment of the disclosure, projections of the first bonding opening and the second bonding opening in the direction are separated from each other.

In an embodiment of the disclosure, the optical film layer and the protective layer respectively have two portions located between the first bonding opening and the second bonding opening. The two portions overlap in the direction.

In an embodiment of the disclosure, at least one of the first sensing electrode layer or the second sensing electrode layer is a silver nanowire electrode layer.

In an embodiment of the disclosure, the substrate is a flexible substrate.

In an embodiment of the disclosure, a material of the substrate comprises cyclo olefin polymer. A thickness of the substrate is equal to or less than 25 μm.

In an embodiment of the disclosure, a material of the substrate comprises colorless polyimide. A thickness of the substrate is equal to or less than 12.5 μm.

In an embodiment of the disclosure, the optical film layer includes a pressure-sensitive adhesive layer, a covering layer, at least one phase retarder, and a polyvinyl alcohol layer. The covering layer is disposed at a side of the pressure-sensitive adhesive layer away from the substrate. The at least one phase retarder is disposed between the pressure-sensitive adhesive layer and the covering layer. The polyvinyl alcohol layer is disposed between the covering layer and the at least one phase retarder.

According to an embodiment of the disclosure, an electronic device includes the bonding structure, a flexible circuit board, a display module, and a cover plate. The flexible circuit board includes a first bonding portion and a second bonding portion. The first bonding portion bonds the part of the first sensing electrode layer exposed through the first bonding opening. The second bonding portion bonds the part of the second sensing electrode layer exposed through the second bonding opening. The display module is disposed at a side of the protective layer away from the substrate. The cover plate is disposed at a side of the optical film layer away from the substrate.

In an embodiment of the disclosure, the electronic device further includes a reinforcing layer disposed between the protective layer and the display module.

In an embodiment of the disclosure, the electronic device further includes an adhesive layer disposed between the reinforcing layer and the display module.

In an embodiment of the disclosure, the electronic device further includes an adhesive layer disposed between the protective layer and the display module and arranged side by side with the reinforcing layer.

Accordingly, in the bonding structure and the electronic device of the present disclosure, by misaligning the first bonding opening of the optical film layer and the second bonding opening of the protective layer in a direction substantially perpendicular to the substrate to substantially and partially thicken, the structural strength of the bonding area of the substrate can be effectively increased. In this way, the substrate can be effectively prevented from cracking when the edge of the substrate is impacted or the bonding area is bonded to the flexible circuit board, and the sensing function and signal transmission function of the first sensing electrode layer and the second sensing electrode layer disposed on the substrate can be ensured.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Figure 1A:
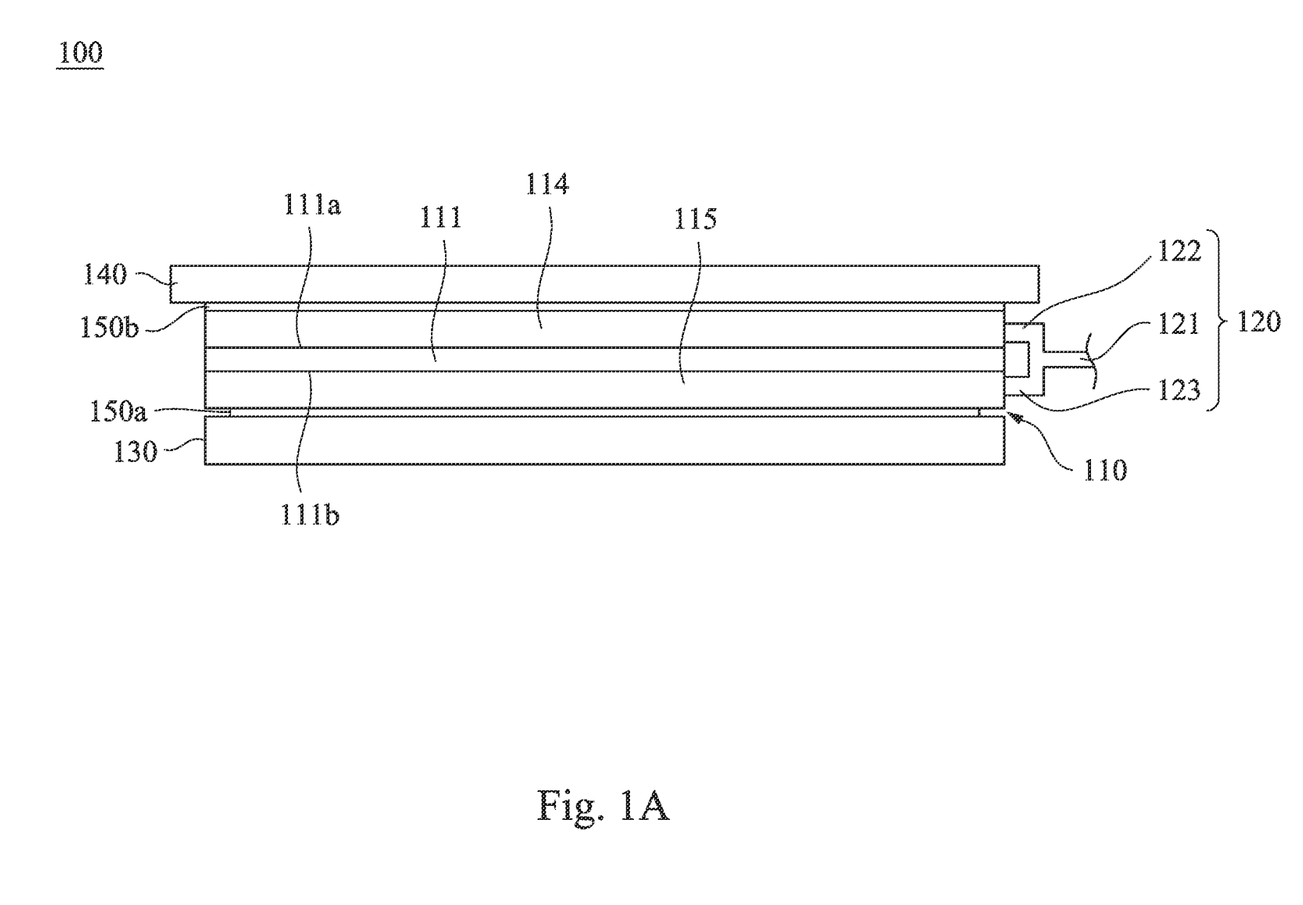
FIG. 1A is a side view of an electronic device according to an embodiment of the present disclosure.
Figure 1B:
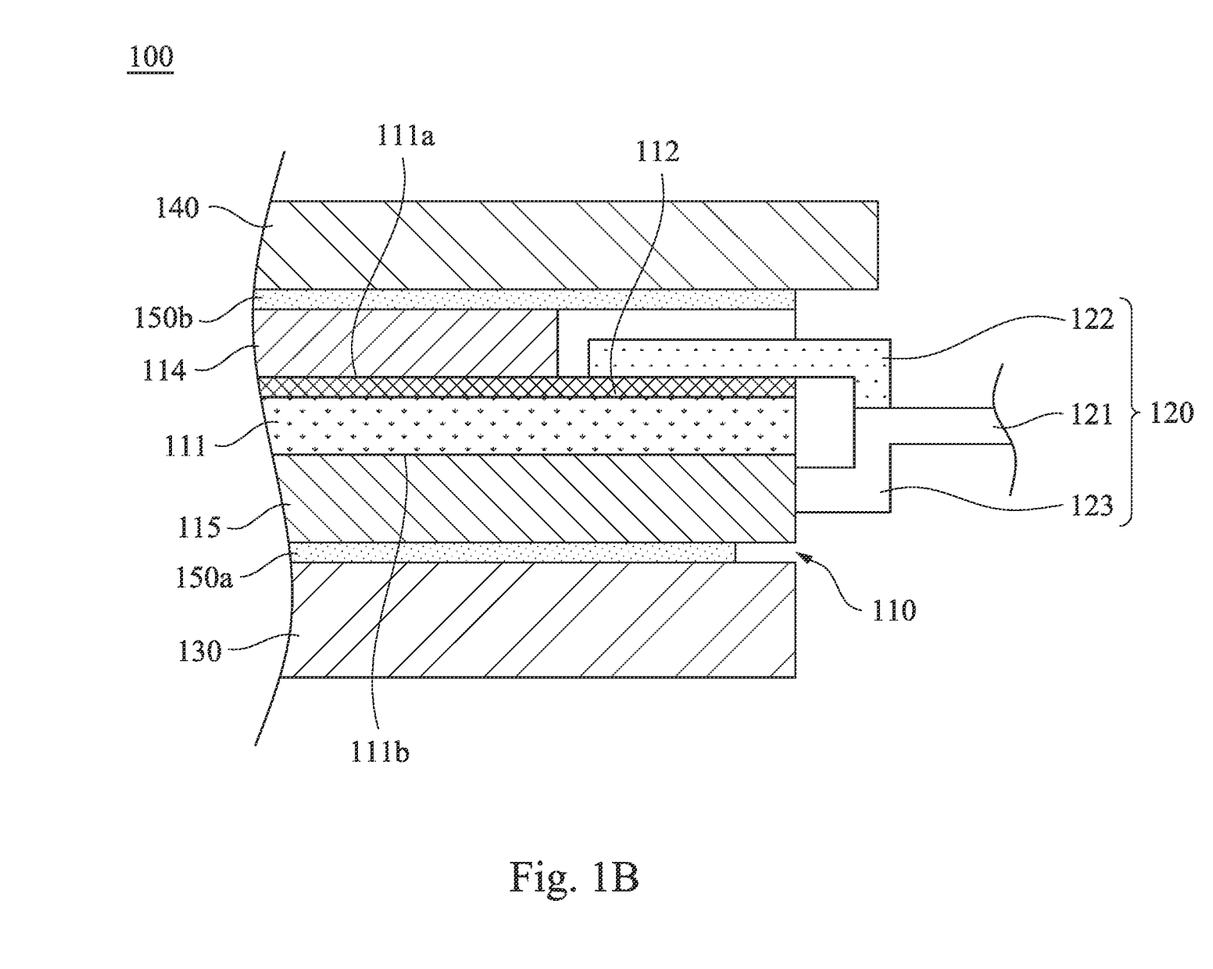
FIG. 1B is a partial cross-sectional view of the electronic device in FIG. 1A, which corresponds to the position indicated by line 1B-1B in FIG. 2.
Figure 1C:
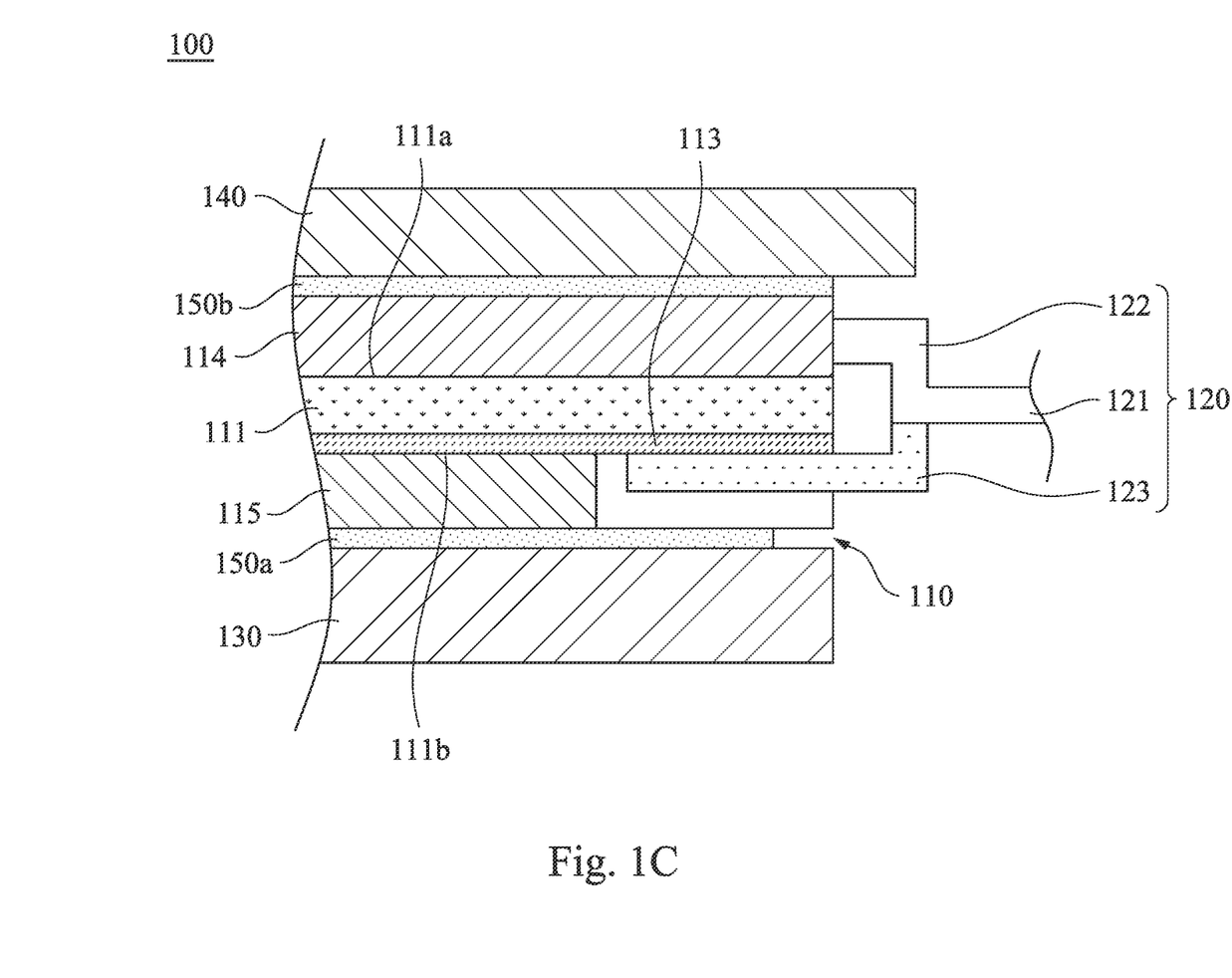
FIG. 1C is another cross-sectional view of the electronic device in FIG. 1A, which corresponds to the position indicated by line 1C-1C in FIG. 2.

Reference is made to FIG. 1A, FIG. 1B, and FIG. 1C. FIG. 1A is a side view of an electronic device 100 according to an embodiment of the present disclosure. FIG. 1B is a partial cross-sectional view of the electronic device 100 in FIG. 1A, which corresponds to the position indicated by line 1B-1B in FIG. 2. FIG. 1C is another cross-sectional view of the electronic device 100 in FIG. 1A, which corresponds to the position indicated by line 1C-1C in FIG. 2. As shown in FIGS. 1A to 1C, in the present embodiment, the electronic device 100 includes a bonding structure 110, a flexible circuit board 120, a display module 130, and a cover plate 140. The flexible circuit board 120 is bonded to the bonding structure 110. The display module 130 and the cover plate 140 are respectively disposed at two opposite sides of the bonding structure 110. Specifically, the display module 130 is fixed to the bonding structure 110 through an adhesive layer 150a, and the cover plate 140 is fixed to the bonding structure 110 through an adhesive layer 150b.

In some embodiments, at least one of the adhesive layer 150a, 150b is an optical clear adhesive (OCA), but the disclosure is not limited in this regard.

In detail, the bonding structure 110 includes a substrate 111, a first sensing electrode layer 112, a second sensing electrode layer 113, an optical film layer 114, and a protective layer 115. The substrate 111 has a first surface 111a and a second surface 111b opposite to each other. The first sensing electrode layer 112 is disposed on the first surface 111a. The second sensing electrode layer 113 is disposed on the second surface 111b. The optical film layer 114 covers the first sensing electrode layer 112. The protective layer 115 covers the second sensing electrode layer 113. The display module 130 is disposed at a side of the protective layer 115 away from the substrate 111. The cover plate 140 is disposed at a side of the optical film layer 114 away from the substrate 111.

In some embodiments, at least one of the first sensing electrode layer 112 or the second sensing electrode layer 113 may be a silver nanowire (SNW; also known as AgNW) electrode layer, a metal grid, or an Indium tin oxide (ITO) electrode layer, but the disclosure is not limited in this regard. In the embodiments in which the at least one of the first sensing electrode layer 112 or the second sensing electrode layer 113 is an SNW electrode layer, the at least one of the first sensing electrode layer 112 or the second sensing electrode layer 113 may include a substrate and silver nanowires doped therein. The silver nanowires overlap each other in the substrate to form a conductive network. The substrate refers to a non-nanosilver material formed by a solution containing the silver nanowires through processes such as coating, heating, and drying. The silver nanowires are distributed or embedded in the substrate and partially protrude out from the substrate. The substrate can protect the silver nanowires from an external environment, such as from corrosion and abrasion. In some embodiments, the substrate is compressible.

Figure 2:
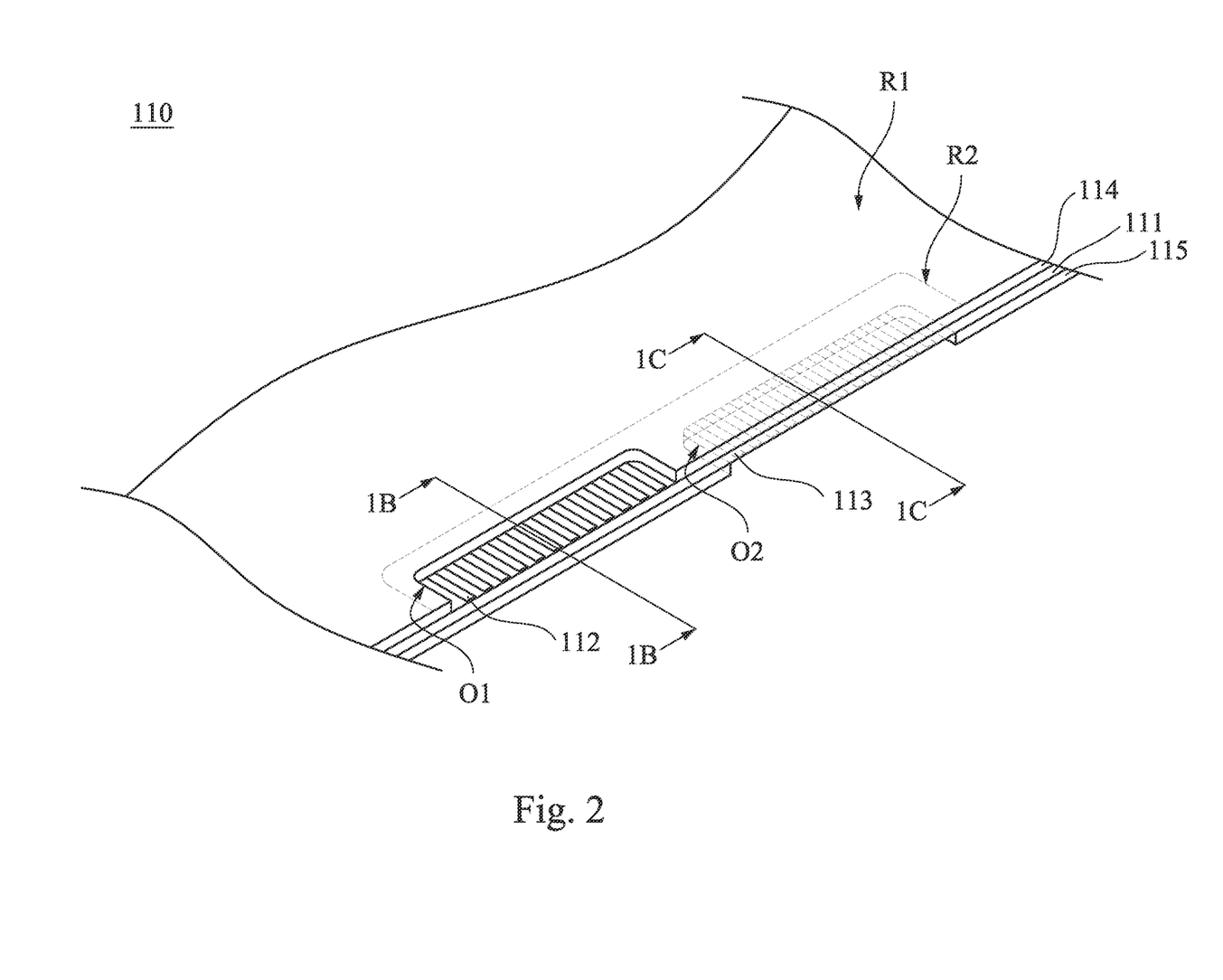
FIG. 2 is a partial perspective view of a bonding structure according to an embodiment of the present disclosure.
Figure 3:
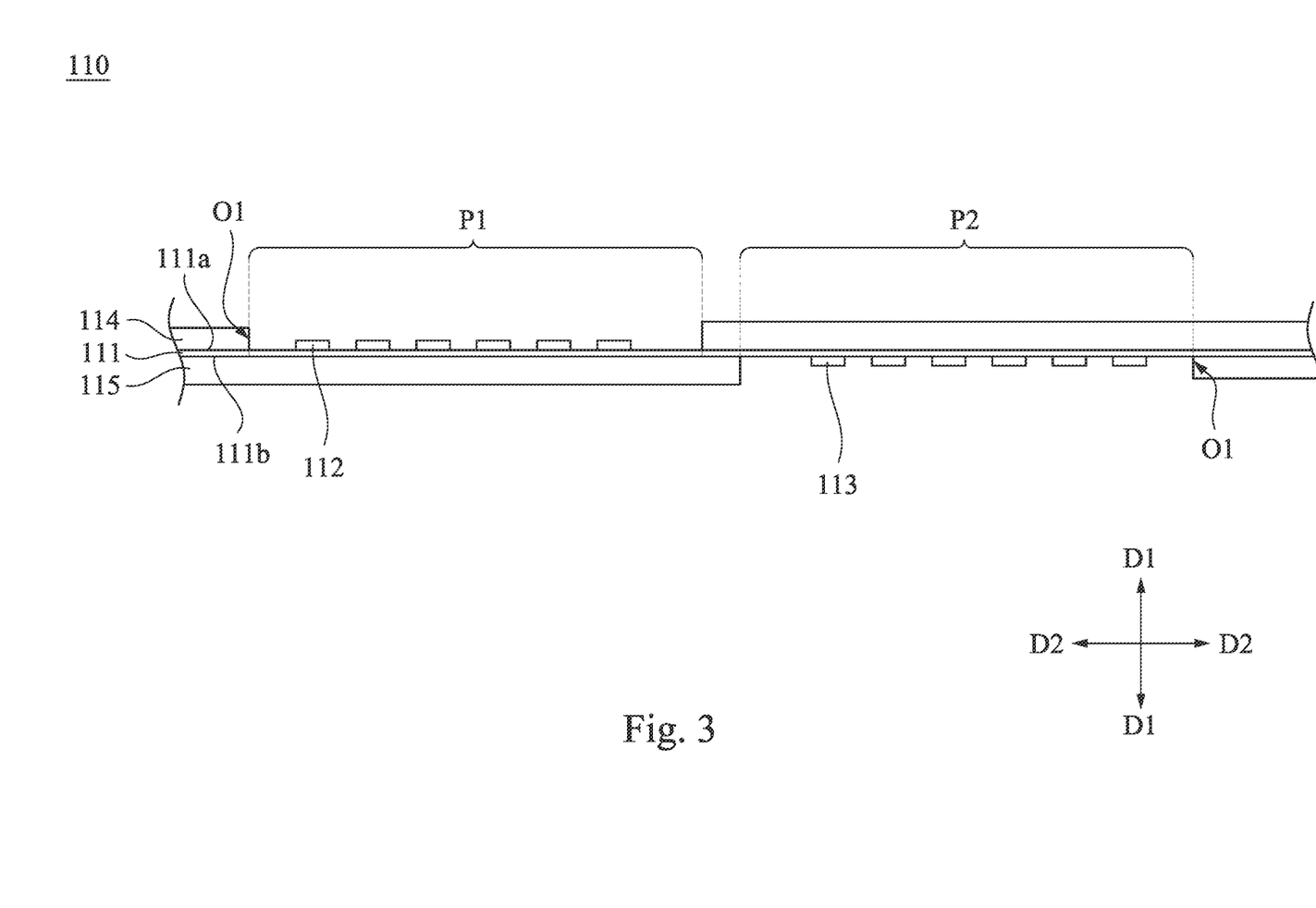
FIG. 3 is a partial side view of the bonding structure in FIG. 2.
Figure 4:
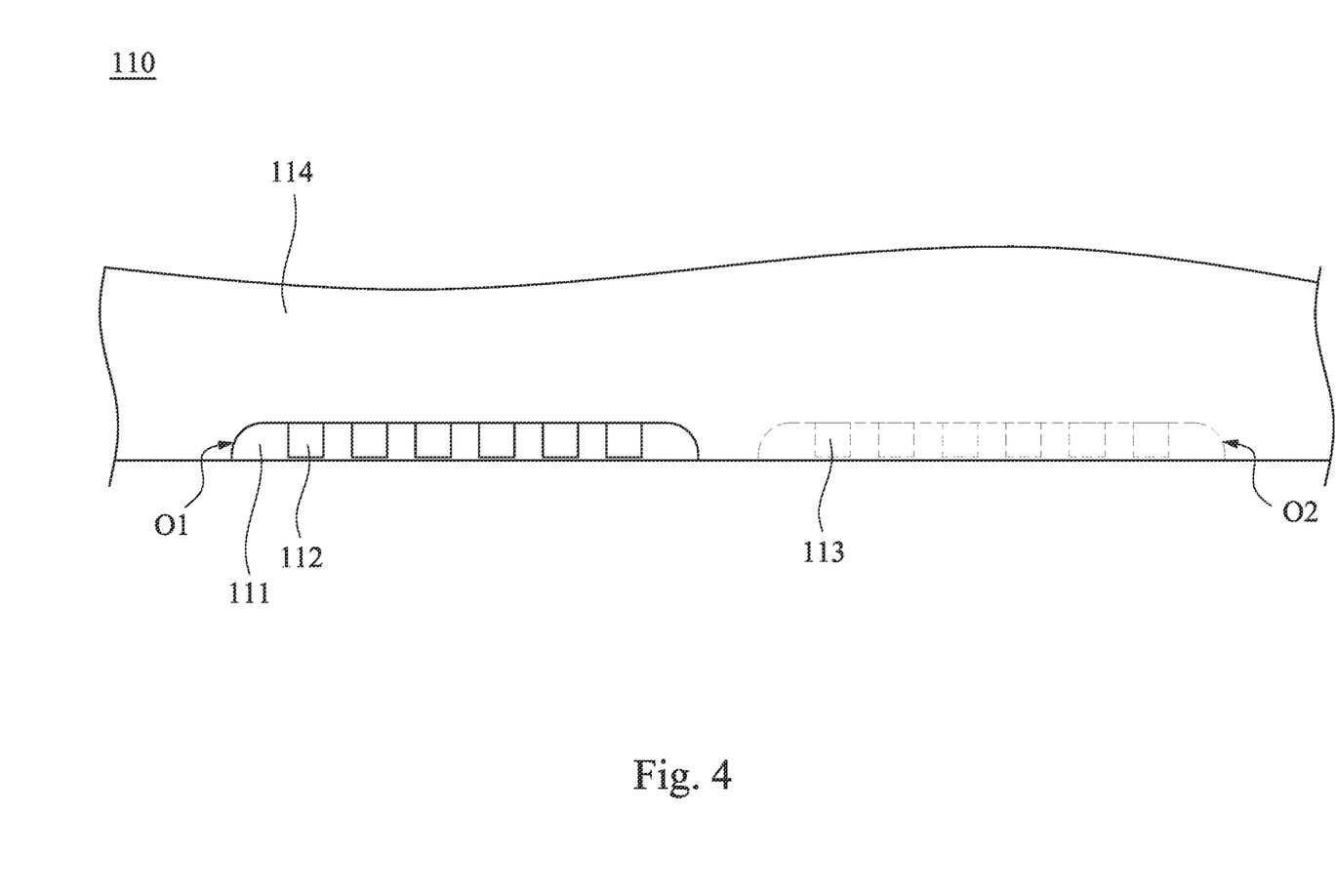
FIG. 4 is a partial top view of the bonding structure in FIG. 2.

Reference is made to FIG. 2 to FIG. 4. FIG. 2 is a partial perspective view of the bonding structure 110 according to an embodiment of the present disclosure. FIG. 3 is a partial side view of the bonding structure 110 in FIG. 2. FIG. 4 is a partial top view of the bonding structure 110 in FIG. 2. As shown in FIGS. 2 to 4, in the present embodiment, a sensing area R1 and a bonding area R2 are defined on the substrate 111. The optical film layer 114 has a first bonding opening O1 located in the bonding area R2. A part of the first sensing electrode layer 112 extending in the sensing area R1 is covered by the optical film layer 114, and a part of the first sensing electrode layer 112 extending in the bonding area R2 is exposed through the first bonding opening O1. The protective layer 15 has a second bonding opening O2 located in the bonding area R2. A part of the second sensing electrode layer 113 extending in the sensing area R1 is covered by the protective layer 15, and a part of the second sensing electrode layer 113 extending in the bonding area R2 is exposed through the second bonding opening O2.

With reference to FIG. 1A, in the present embodiment, the flexible circuit board 120 includes a main body portion 121, a first bonding portion 122, and a second bonding portion 123. The first bonding portion 122 and the second bonding portion 123 extend from an edge of the main body portion 121. The first bonding portion 122 bonds the part of the first sensing electrode layer 112 exposed through the first bonding opening O1. The second bonding portion 123 bonds the part of the second sensing electrode layer 113 exposed through the second bonding opening O2.

In some embodiments, the first sensing electrode layer 112 includes a plurality of first-axis conductive units (not shown) separated from each other. The second sensing electrode layer 113 includes a plurality of second-axis conductive units (not shown) separated from each other. With the aforementioned structural configuration, touch signals (such as mutual capacitance sensing signals) between the first sensing electrode layer 112 and the second sensing electrode layer 113 can be extracted through the flexible circuit board 120.

In particular, as shown in FIGS. 2 to 4, in the present embodiment, the first bonding opening O1 of the optical film layer 114 and the second bonding opening O2 of the protective layer 15 are misaligned in a direction D1 perpendicular to the first surface 111a or the second surface 111b of the substrate 111. In other words, the first bonding opening O1 and the second bonding opening O2 do not overlap in the direction D1. In detail, as shown in FIG. 3, the position of the second surface 111b of the substrate 111 corresponding to the first bonding opening O1 is supported by the protective layer 115, and the position of the first surface 111a of the substrate 111 corresponding to the second bonding opening O2 is supported by the optical film layer 114. With this structural configuration, the structural strength of the bonding area R2 of the substrate 111 can be effectively increased. In this way, the bonding structure 110 of the present embodiment can effectively prevent the substrate 111 from generating cracks when the edge of the substrate 111 is impacted, thereby ensuring the sensing functions of the first sensing electrode layer 112 and the second sensing electrode layer 113 disposed on the substrate 111.

Figure 5:
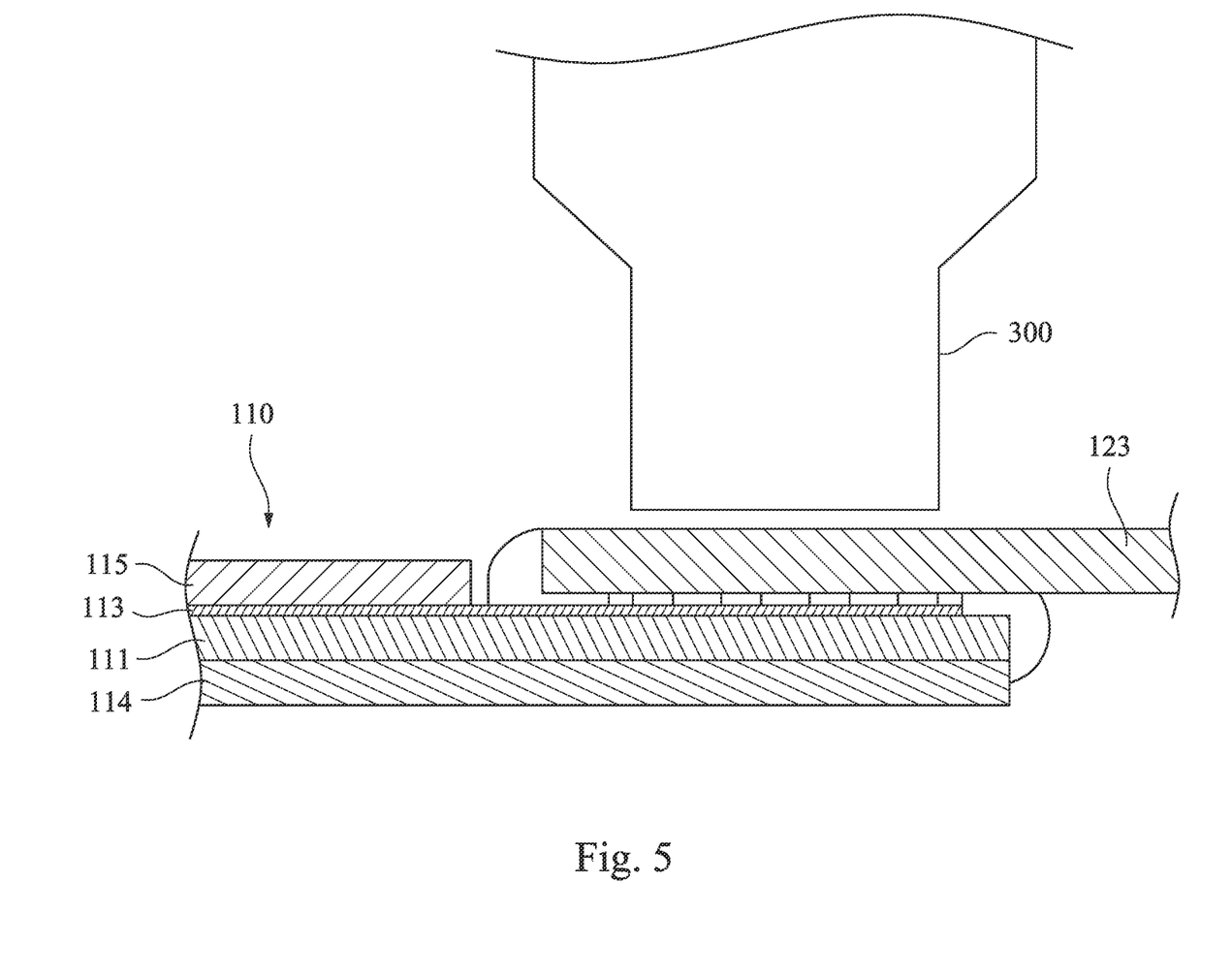
FIG. 5 is a partial cross-sectional view showing the use of a pressing head to bond a flexible circuit board and the bonding structure.

Reference is made to FIG. 5. FIG. 5 is a partial cross-sectional view showing the use of a pressing head 300 to bond the flexible circuit board 120 and the bonding structure 110. Specifically, FIG. 5 shows the pressing head 300 pressing the second bonding portion 123 of the flexible circuit board 120 to the second sensing electrode layer 113 on the second surface 111b of the substrate 111. Although not shown, it can be understood that the first bonding portion 122 of the flexible circuit board 120 can also be pressed to the first sensing electrode layer 112 on the first surface 111a of the substrate 111 by the pressing head 300. As mentioned above, since the position of the second surface 111b of the substrate 111 corresponding to the first bonding opening O1 is supported by the protective layer 115 and the position of the first surface 111a of the substrate 111 corresponding to the second bonding opening O2 is supported by the optical film layer 114, the bonding area R2 of the substrate 111 can have a relatively large structural strength to withstand the pressing force of the pressing head 300. In this way, the bonding structure 110 of the present embodiment can effectively prevent the substrate 111 from cracking when the bonding area R2 of the substrate 111 is bonded to the flexible circuit board 120, thereby ensuring the signal transmission functions of the first sensing electrode layer 112 and the second sensing electrode layer 113 disposed on the substrate 111.

Figure 6:
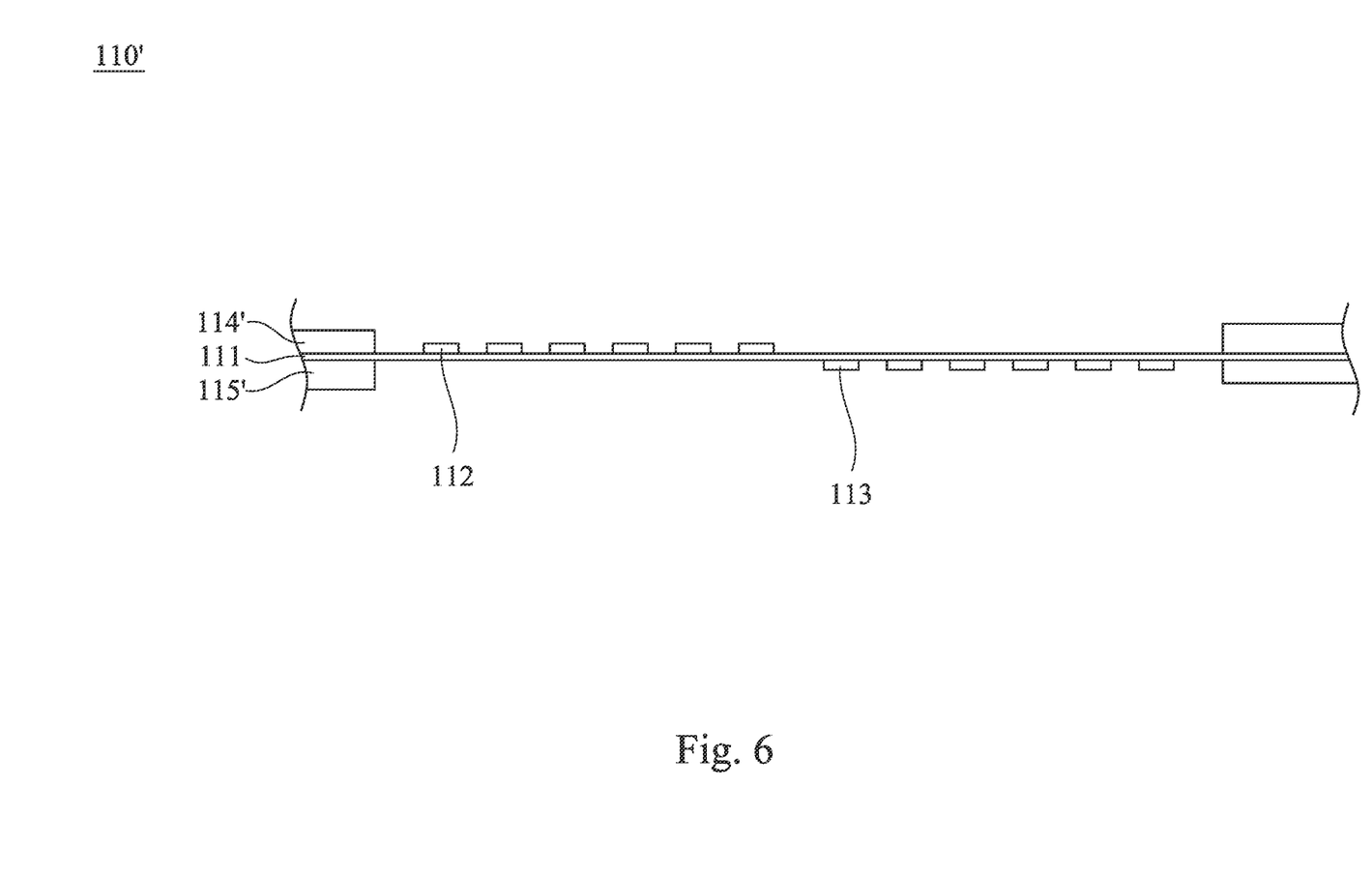
FIG. 6 is a partial side view of another bonding structure.

Reference is made to FIG. 6. FIG. 6 is a partial side view of another bonding structure 110' before improvement. As shown in FIG. 6, the bonding structure 110' includes a substrate 111, a first sensing electrode layer 112, a second sensing electrode layer 113, an optical film layer 114', and a protective layer 115'. The first sensing electrode layer 112 is disposed on the upper surface of the substrate 111. The optical film layer 114' covers the first sensing electrode layer 112. The second sensing electrode layer 113 is disposed on the lower surface of the substrate 111. The protective layer 115' covers the second sensing electrode layer 113. Compared with the embodiment shown in FIG. 3, the bonding opening of the optical film layer 114' of the bonding structure 110' shown in FIG. 6 for exposing the first sensing electrode layer 112 overlaps the bonding opening of the protective layer 115' for exposing the second sensing electrode layer 113. In other words, the bonding opening of the optical film layer 114' does not overlap with the protective layer 115', and the bonding opening of the protective layer 115' does not overlap with the optical film layer 114' either. In experiments bonding with the flexible circuit board 120, since the bonding structure 110' shown in FIG. 6 is not locally thickened at the bonding openings, the defect rate of cracks is 3.84%. In contrast, since the substrate 111 of the bonding structure 110 shown in FIG. 3 is thickened by the protective layer 115 on the other side corresponding to the first bonding opening O1 and is thickened by the optical film layer 114 on the other side corresponding to the second bonding opening O2, the defect rate of cracks can be reduced to zero. Therefore, FIG. 3 shows a preferred embodiment.

In some embodiments, the substrate 111 is a flexible substrate. In some embodiments, a material of the substrate 111 includes cyclo olefin polymer (COP), and a thickness of the substrate 111 is equal to or less than about 25 μm, but the present embodiment is not limited in this regard. In some embodiments, a material of the substrate 111 includes colorless polyimide (CPI), and a thickness of the substrate 111 is equal to or less than about 12.5 μm, but the present embodiment is not limited in this regard. In the case where the substrate 111 is flexible and has a small thickness, the effect of improving the structural strength of the bonding area R2 of the substrate 111 through the aforementioned structural configuration is more significant.

As shown in FIG. 3, in the present embodiment, a projection P1 of the first bonding opening O1 of the optical film layer 114 in the direction D1 and a projection P2 of the second bonding opening O2 of the protective layer 115 in the direction D1 are separated from each other. From another perspective, the optical film layer 114 and the protective layer 115 respectively have portions located between the first bonding opening O1 and the second bonding opening O2 in a direction D2. These portions overlap in the direction D1. For example, the direction D2 is substantially perpendicular to the direction D1, but the disclosure is not limited in this regard. By designing the optical film layer 114 and the protective layer 115 to have the overlapping portions (in the direction D1) between the first bonding opening O1 and the second bonding opening O2, the structural strength of the bonding area R2 of the substrate 111 can be further increased.

Figure 7:
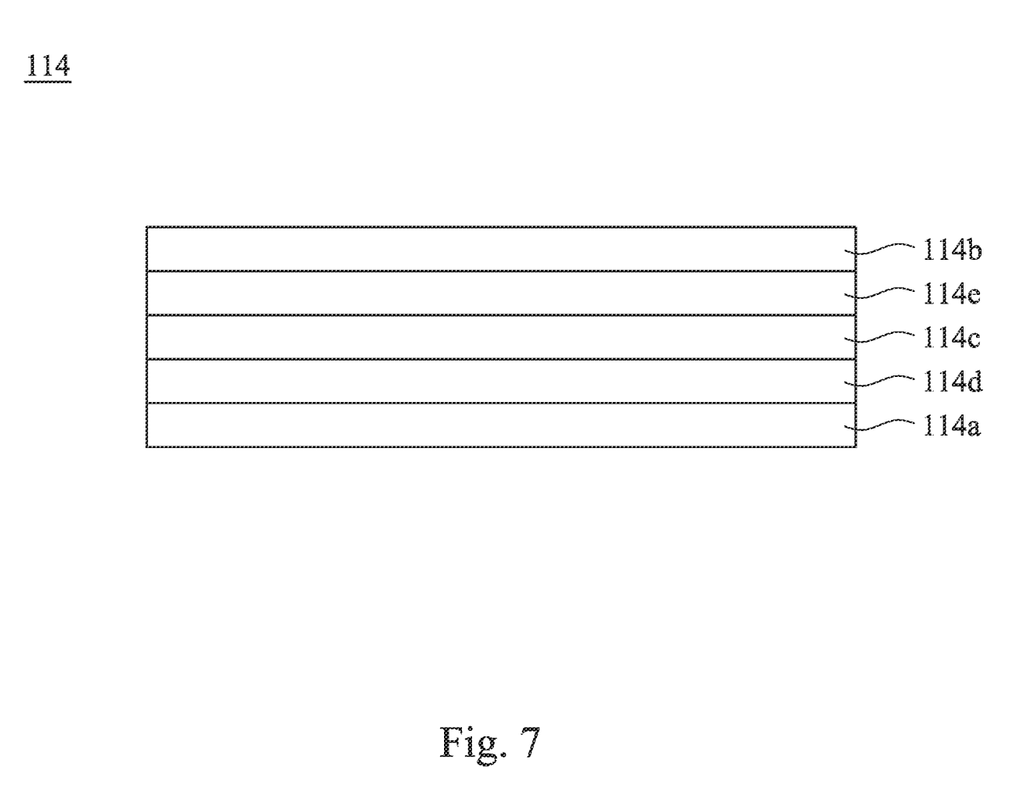
FIG. 7 is a schematic diagram of an optical film layer according to an embodiment of the present disclosure.

Reference is made to FIG. 7. FIG. 7 is a schematic diagram of the optical film layer 114 according to an embodiment of the present disclosure. As shown in FIG. 7, in the present embodiment, the optical film layer 114 includes a pressure-sensitive adhesive layer 114a, a covering layer 114b, phase retarders 114c, 114d, and a polyvinyl alcohol layer 114e. The covering layer 114b is disposed at a side of the pressure-sensitive adhesive layer 114a away from the substrate 111. The phase retarder 114c is disposed between the pressure-sensitive adhesive layer 114a and the covering layer 114b. The phase retarder 114d is disposed between the phase retarder 114c and the pressure-sensitive adhesive layer 114a. The polyvinyl alcohol layer 114e is disposed between the covering layer 114b and the phase retarder 114c.

In some embodiments, the phase retarders 114c, 114d are respectively a half-wave plate and a quarter-wave plate, but the present disclosure is not limited in this regard.

It should be noted that a conventional thickness of the optical film layer 114 is about 110 μm to about 150 μm. In some embodiments, for folding requirements, a thickness of the optical film layer 114 may be reduced to about 60 μm to about 75 μm (for example, about 66 μm), but the present disclosure is not limited in this regard. In some embodiments, a thickness of the pressure-sensitive adhesive layer 114*a* is about 10 μm to about 20 μm (for example, about 15 μm), but the present disclosure is not limited in this regard. In some embodiments, a thickness of the covering layer 114*b* is about 35 μm to about 45 μm (for example, about 40 μm), but the present disclosure is not limited in this regard. In some embodiments, a thickness of the polyvinyl alcohol layer 114*e* is about 2 μm to about 8 μm (for example, about 5 μm), but the present disclosure is not limited in this regard.

Figure 8:
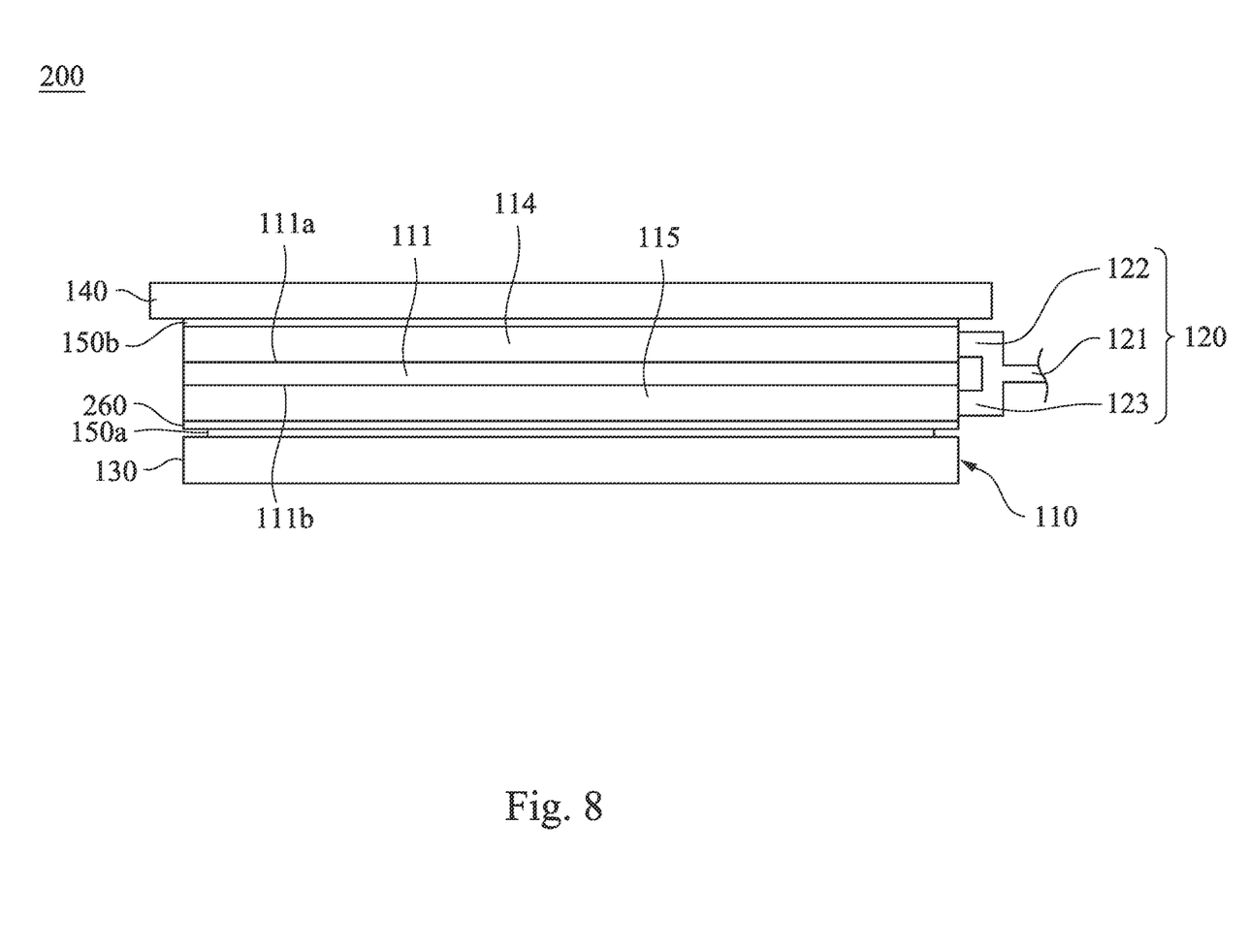
FIG. 8 is a side view of an electronic device according to another embodiment of the present disclosure.

Reference is made to FIG. 8. FIG. 8 is a side view of an electronic device 200 according to another embodiment of the present disclosure. As shown in FIG. 8, in the present embodiment, the electronic device 200 includes a bonding structure 110, a flexible circuit board 120, a display module 130, and a cover plate 140. These components are the same as those in the embodiment shown in FIG. 1A. Therefore, reference may be made to the relevant description above and will not be repeated here. Compared with the embodiment shown in FIG. 1A, the electronic device 200 of the present embodiment further includes a reinforcing layer 260. The reinforcing layer 260 is disposed between the protective layer 115 of the bonding structure 110 and the display module 130. Specifically, the reinforcing layer 260 is attached to the protective layer 115 and is fixed to the display module 130 through the adhesive layer 150*a*. For example, in an embodiment where the thickness of the substrate 111 is less than about 12.5 μm, the reinforcing layer 260 may additionally provide support for the substrate 111 in addition to the optical film layer 114 and the protective layer 115.

Figure 9:
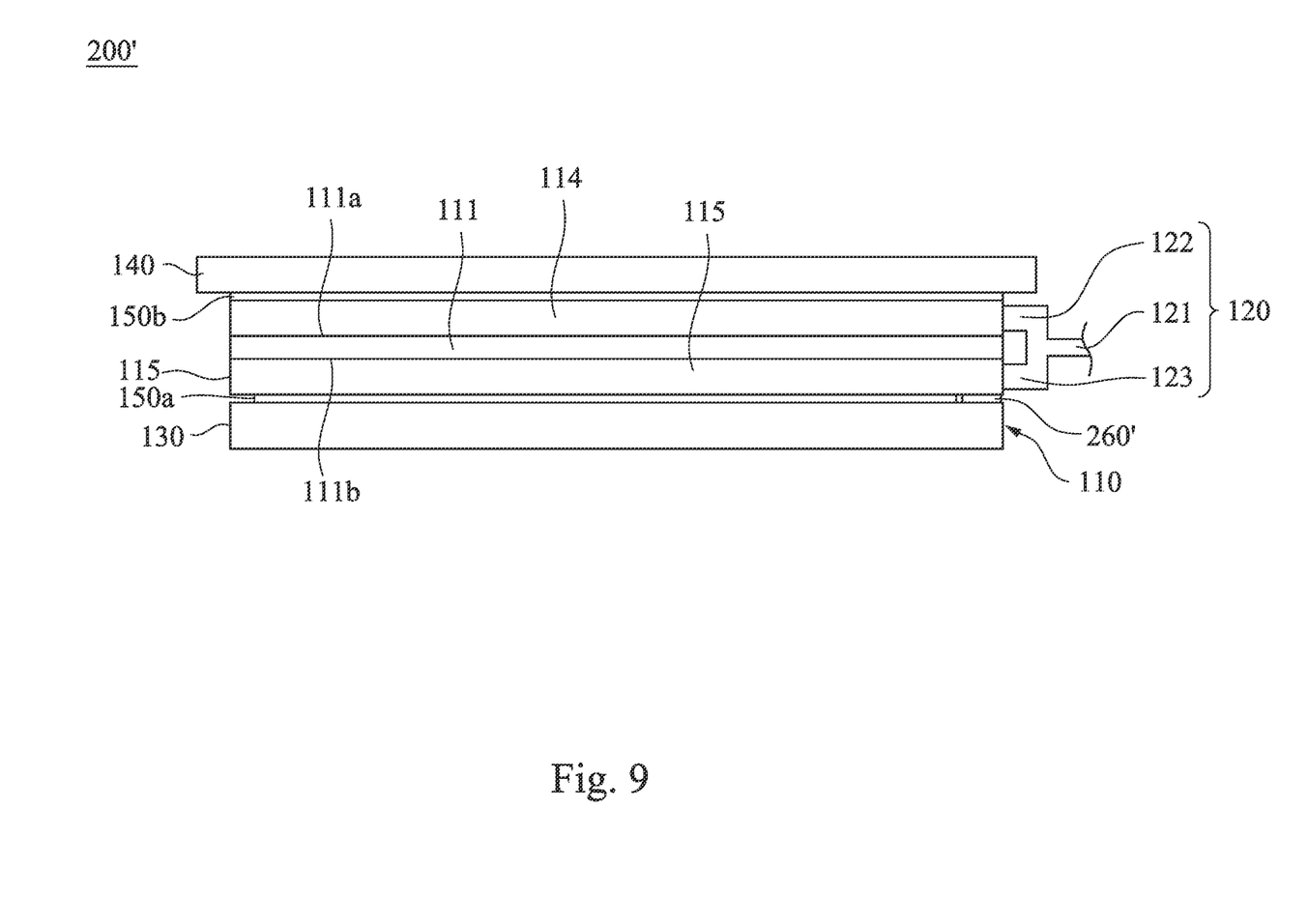
FIG. 9 is a side view of an electronic device according to another embodiment of the present disclosure.

Reference is made to FIG. 9. FIG. 9 is a side view of an electronic device 200' according to another embodiment of the present disclosure. As shown in FIG. 9, in the present embodiment, the electronic device 200' includes a bonding structure 110, a flexible circuit board 120, a display module 130, and a cover plate 140. These components are the same as those in the embodiment shown in FIG. 1A. Therefore, reference may be made to the relevant description above and will not be repeated here. Compared with the embodiment shown in FIG. 1A, the electronic device 200' of the present embodiment further includes a reinforcing layer 260'. The reinforcing layer 260' is disposed between the protective layer 115 of the bonding structure 110 and the display module 130. Specifically, the reinforcing layer 260' is attached to the protective layer 115 and is arranged side by side with the adhesive layer 150*a* such that the reinforcing layer 260' and the adhesive layer 150*a* are attached to the bottom surface of the protective layer 115. In other words, compared with the reinforcing layer 260 attached to the entire bottom surface of the protective layer 115 as shown in FIG. 8, the reinforcing layer 260' of the present embodiment is only partially attached to the bottom surface of the protective layer 115 and locally strengthens the structural strength of the bonding area R2.

According to the foregoing recitations of the embodiments of the disclosure, it can be seen that in the bonding structure and the electronic device of the present disclosure, by misaligning the first bonding opening of the optical film layer and the second bonding opening of the protective layer in a direction substantially perpendicular to the substrate to substantially and partially thicken, the structural strength of the bonding area of the substrate can be effectively increased. In this way, the substrate can be effectively prevented from cracking when the edge of the substrate is impacted or the bonding area is bonded to the flexible circuit board, and the sensing function and signal transmission function of the first sensing electrode layer and the second sensing electrode layer disposed on the substrate can be ensured.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electronic device, comprising:
   a bonding structure comprising:
      a substrate having a first surface and a second surface opposite to each other, a sensing area and a bonding area being defined on the substrate;
      a first sensing electrode layer disposed on the first surface;
      a second sensing electrode layer disposed on the second surface;
      an optical film layer covering the first sensing electrode layer and having a first bonding opening located in the bonding area; and
      a protective layer covering the second sensing electrode layer and having a second bonding opening located in the bonding area,
      wherein the first bonding opening and the second bonding opening respectively expose a part of the first sensing electrode layer and a part of the second sensing electrode layer, and the first bonding opening and the second bonding opening are misaligned in a direction perpendicular to the first surface or the second surface;
   a cover plate disposed at a side of the optical film layer away from the substrate; and
   a flexible circuit board comprising a first bonding portion and a second bonding portion, wherein the first bonding portion is disposed between the cover plate and the first sensing electrode layer.

2. The electronic device of claim 1, further comprising:
a display module disposed at a side of the protective layer away from the substrate.

3. The electronic device of claim 1, further comprising:
a display module disposed at a side of the protective layer away from the substrate, wherein the second bonding portion is disposed between the second sensing electrode layer and the display module.

4. An electronic device, comprising:
   a bonding structure comprising:
      a substrate having a first surface and a second surface opposite to each other, a sensing area and a bonding area being defined on the substrate;
      a first sensing electrode layer disposed on the first surface;
      a second sensing electrode layer disposed on the second surface;
      an optical film layer covering the first sensing electrode layer and having a first bonding opening located in the bonding area; and
      a protective layer covering the second sensing electrode layer and having a second bonding opening located in the bonding area,
      wherein the first bonding opening and the second bonding opening respectively expose a part of the first sensing electrode layer and a part of the second sensing electrode layer, and the first bonding opening and the second bonding opening are misaligned in a direction perpendicular to the first surface or the second surface; and a display module disposed at a side of the protective layer away from the substrate; and a flexible circuit board comprising a bonding portion disposed between the second sensing electrode layer and the display module.

5. The electronic device of claim 4, further comprising:
a reinforcing layer disposed between the protective layer and the display module.

6. The electronic device of claim 5, further comprising:
an adhesive layer disposed between the protective layer and the display module and arranged side by side with the reinforcing layer.

7. The electronic device of claim 4, wherein projections of the first bonding opening and the second bonding opening in the direction are separated from each other.

8. The electronic device of claim 4, wherein the optical film layer and the protective layer respectively have two portions located between the first bonding opening and the second bonding opening, and the two portions overlap in the direction.

9. The electronic device of claim 4, wherein at least one of the first sensing electrode layer or the second sensing electrode layer is a silver nanowire electrode layer.

10. The electronic device of claim 4, wherein the substrate is a flexible substrate.

11. The electronic device of claim 4, wherein a material of the substrate comprises cyclo olefin polymer, and a thickness of the substrate is equal to or less than 25 μm.

12. The electronic device of claim 4, wherein a material of the substrate comprises colorless polyimide, and a thickness of the substrate is equal to or less than 12.5 μm.

13. The electronic device of claim 4, wherein the optical film layer comprises:
a pressure-sensitive adhesive layer;
a covering layer disposed at a side of the pressure-sensitive adhesive layer away from the substrate;
at least one phase retarder disposed between the pressure-sensitive adhesive layer and the covering layer; and
a polyvinyl alcohol layer disposed between the covering layer and the at least one phase retarder.

14. The electronic device of claim 1, wherein projections of the first bonding opening and the second bonding opening in the direction are separated from each other.

15. The electronic device of claim 1, wherein the optical film layer and the protective layer respectively have two portions located between the first bonding opening and the second bonding opening, and the two portions overlap in the direction.

16. The electronic device of claim 1, wherein at least one of the first sensing electrode layer or the second sensing electrode layer is a silver nanowire electrode layer.

17. The electronic device of claim 1, wherein the substrate is a flexible substrate.

18. The electronic device of claim 1, wherein a material of the substrate comprises cyclo olefin polymer, and a thickness of the substrate is equal to or less than 25 μm.

19. The electronic device of claim 1, wherein a material of the substrate comprises colorless polyimide, and a thickness of the substrate is equal to or less than 12.5 μm.

20. The electronic device of claim 1, wherein the optical film layer comprises:
a pressure-sensitive adhesive layer;
a covering layer disposed at a side of the pressure-sensitive adhesive layer away from the substrate;
at least one phase retarder disposed between the pressure-sensitive adhesive layer and the covering layer; and
a polyvinyl alcohol layer disposed between the covering layer and the at least one phase retarder.

* * * * *